US012796381B2

(12) United States Patent
Lee

(10) Patent No.: US 12,796,381 B2
(45) Date of Patent: Nov. 10, 2026

(54) RING CARRIER AND CONTAINER COMPRISING THE SAME

(71) Applicant: SEMES CO., LTD., Cheonan-si (KR)

(72) Inventor: Kwang Pyo Lee, Sejong-si (KR)

(73) Assignee: Semes Co., LTD., Cheonan-si (KR)

( * ) Notice: Subject to any disclaimer, the term of this patent is extended or adjusted under 35 U.S.C. 154(b) by 200 days.

(21) Appl. No.: 18/739,844

(22) Filed: Jun. 11, 2024

(65) Prior Publication Data

US 2025/0087512 A1 Mar. 13, 2025

(30) Foreign Application Priority Data

Sep. 11, 2023 (KR) ........................ 10-2023-0120083

(51) Int. Cl.
*B25J 11/00* (2006.01)
*B65G 47/90* (2006.01)
*H10P 72/10* (2026.01)

(52) U.S. Cl.
CPC .............. *H10P 72/18* (2026.01); *B65G 47/90* (2013.01)

(58) Field of Classification Search
USPC ....................................... 414/749.1, 935–941
See application file for complete search history.

(56) References Cited

U.S. PATENT DOCUMENTS 5,411,358 A * 5/1995 Garric ................. G03F 7/70541 414/940
7,278,813 B2 * 10/2007 Davis .................. H10P 72/3404 414/416.03
8,944,739 B2 * 2/2015 Chen ................... H10P 72/3218 414/217
11,784,073 B2 * 10/2023 Kuo ........................ H10P 72/30 414/217
2005/0022840 A1 * 2/2005 Kobayashi .......... H10P 72/3406 414/935
2007/0081886 A1 * 4/2007 Myoung ............. H10P 72/3406 414/806
2017/0113355 A1 * 4/2017 Genetti ................ B25J 11/0095
2020/0373190 A1 * 11/2020 Lee ..................... H10P 72/0451
2020/0373194 A1 * 11/2020 Volfovski ................ H10P 72/18
(Continued)

FOREIGN PATENT DOCUMENTS

KR 20170016291 A 2/2017
KR 20220118561 A 8/2022
(Continued)

*Primary Examiner* — Jonathan L Sample
(74) *Attorney, Agent, or Firm* — Harness, Dickey & Pierce, P.L.C.

(57) ABSTRACT

The container of the present invention accommodates a ring carrier for supporting a ring provided in a substrate processing apparatus and comprises a housing, in which an accommodation space is formed, a slot provided in the housing and having an insertion groove formed therein, and a block located in the insertion groove, wherein the block protrudes from the slot and extends to the ring carrier and has a support surface for supporting a lower circumference of the ring carrier, and a first inclined surface sloping upward from the support surface in a normal direction of the ring carrier and having a radius larger than an arc of the ring carrier, wherein a boundary line between the support surface and the first inclined surface has a radius at least the same as the arc of the ring carrier.

16 Claims, 9 Drawing Sheets

(56) References Cited

U.S. PATENT DOCUMENTS

| | | | | |
|---|---|---|---|---|
| 2021/0057256 | A1 * | 2/2021 | Bergantz | B25J 11/0095 |
| 2021/0291375 | A1 * | 9/2021 | Bergantz | B25J 9/1692 |
| 2021/0296149 | A1 * | 9/2021 | Green | H10P 72/18 |
| 2022/0093427 | A1 * | 3/2022 | Jang | H10P 72/0436 |

FOREIGN PATENT DOCUMENTS

| | | | | |
|---|---|---|---|---|
| KR | 20220161808 | A | 12/2022 | |
| WO | WO-2020247146 | A1 * | 12/2020 | H10P 72/3404 |

* cited by examiner

[FIG. 1]
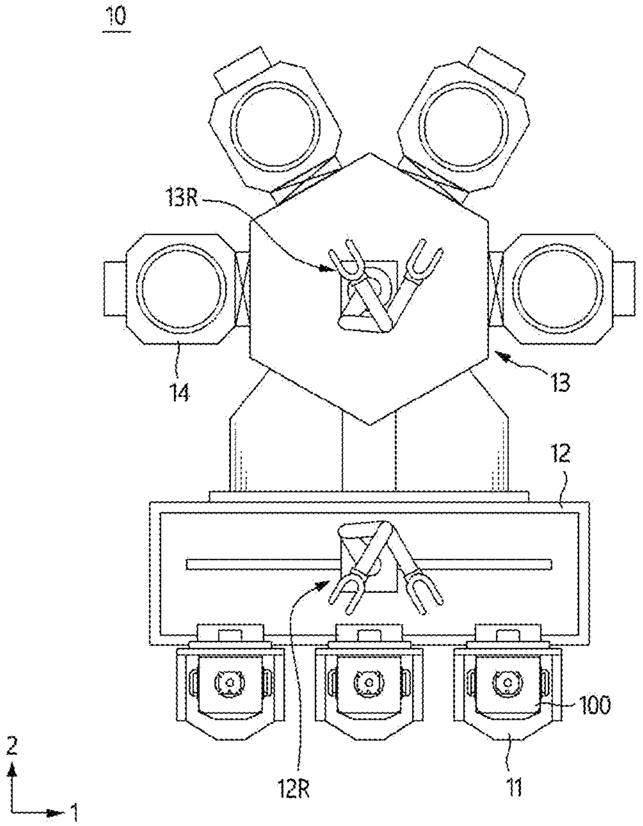

[FIG. 2]
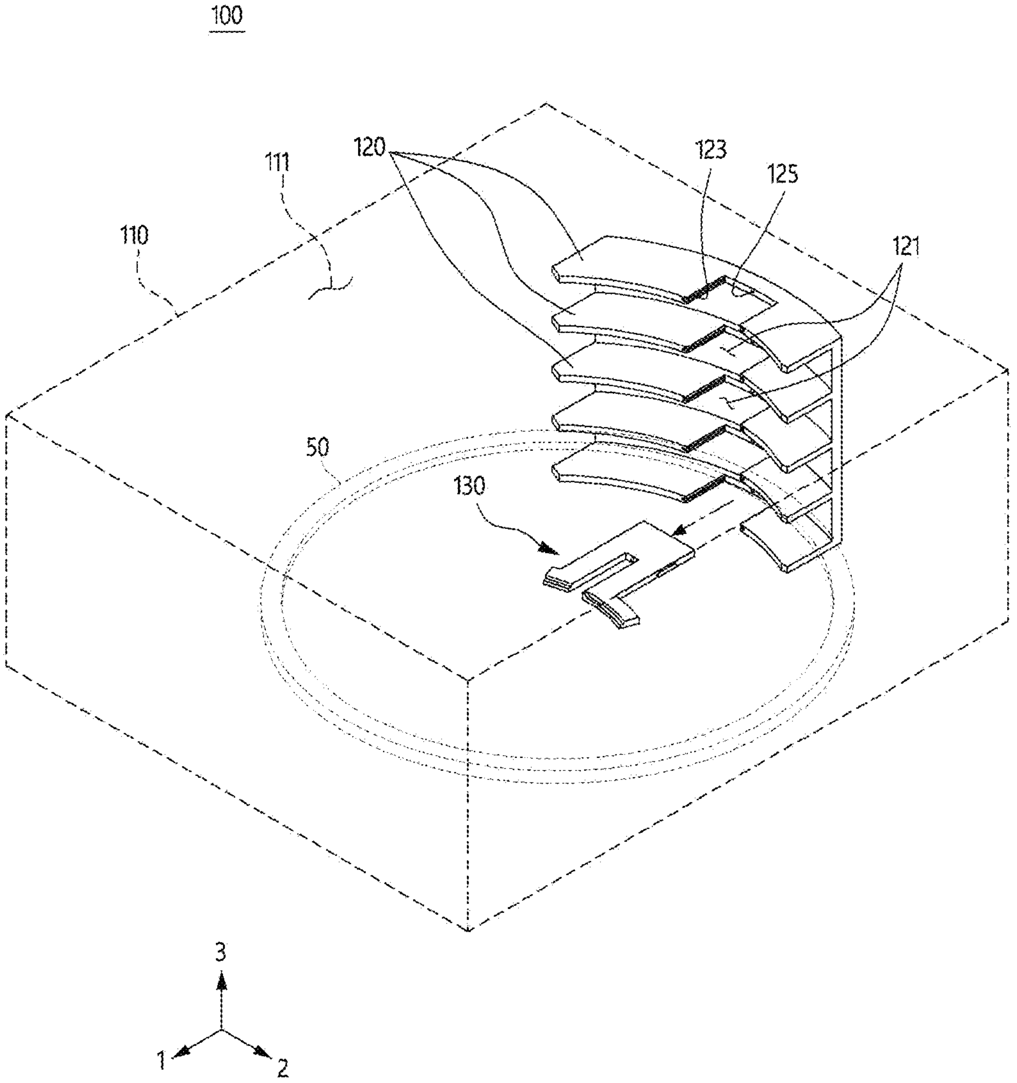

[FIG. 3]
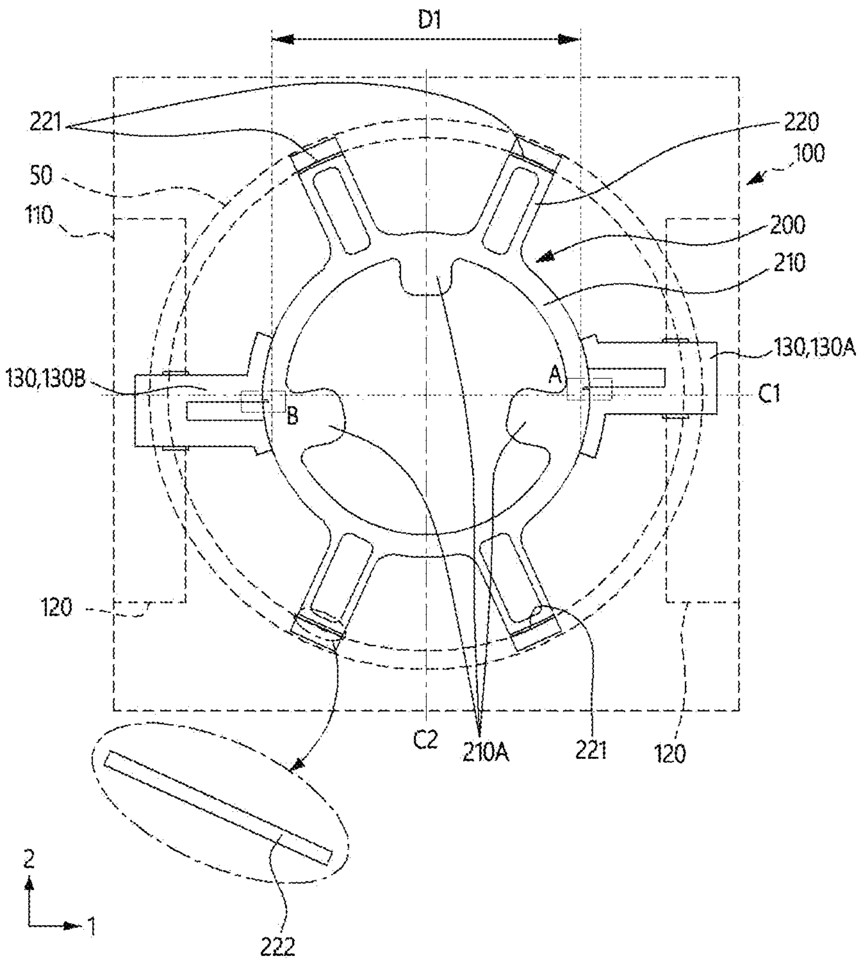

[FIG. 4]
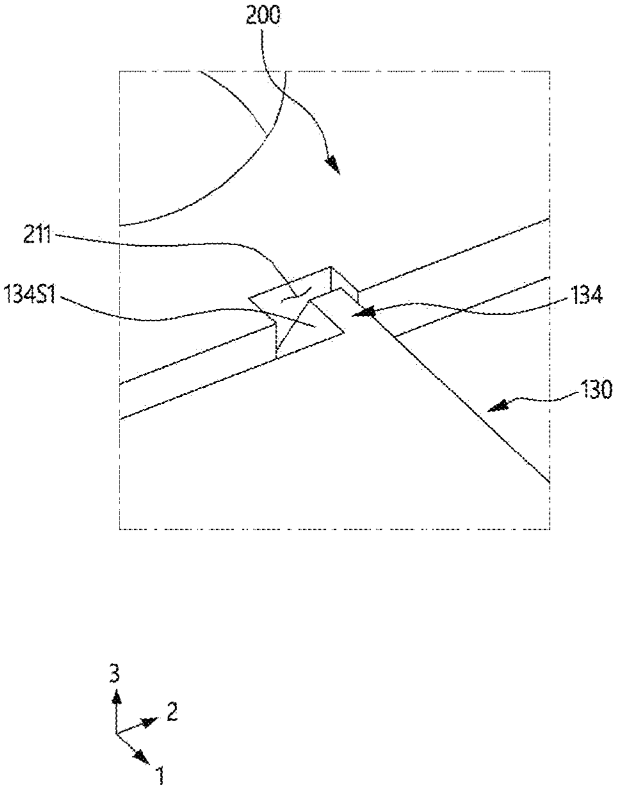

[FIG. 5]
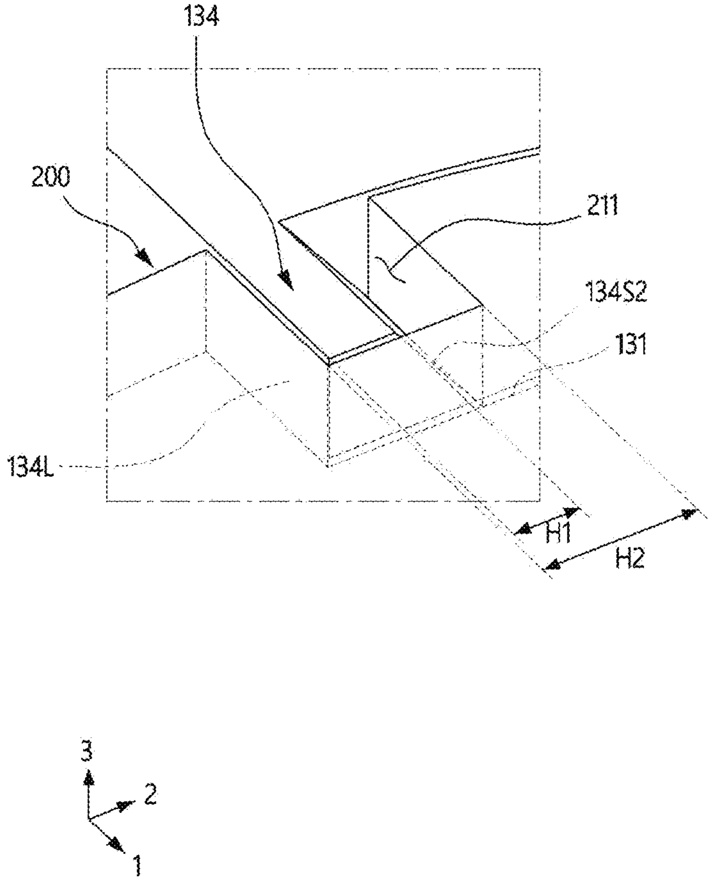

[FIG. 6]
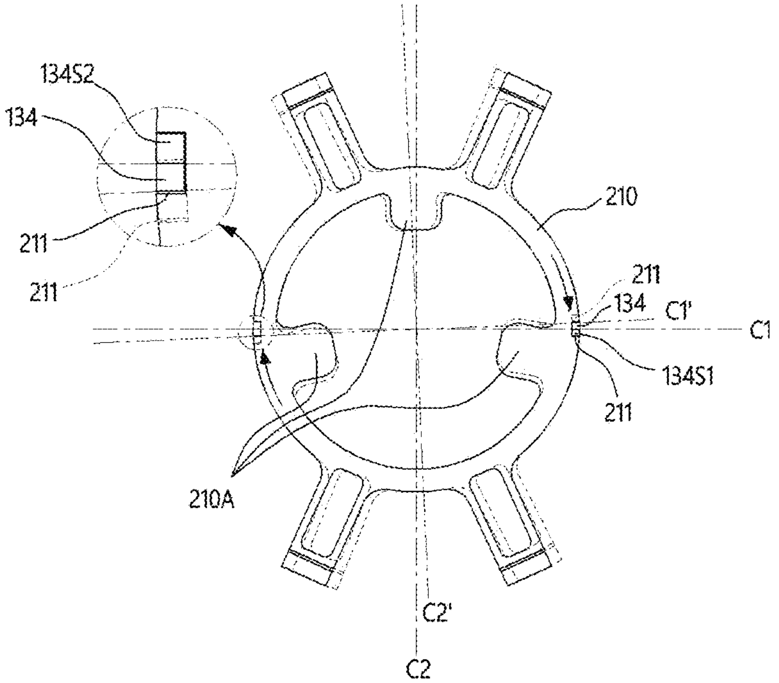
[FIG. 7]
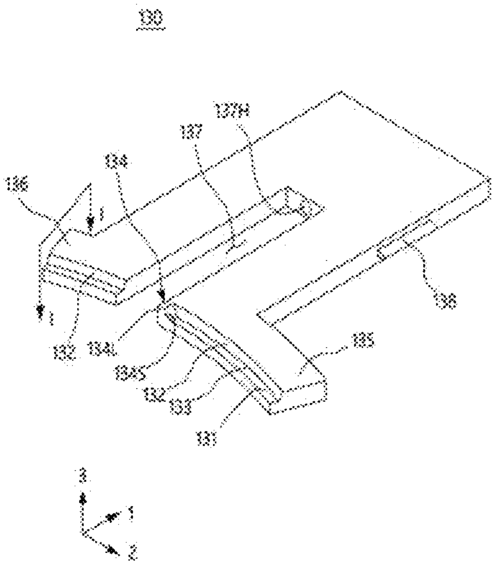

[FIG. 8]
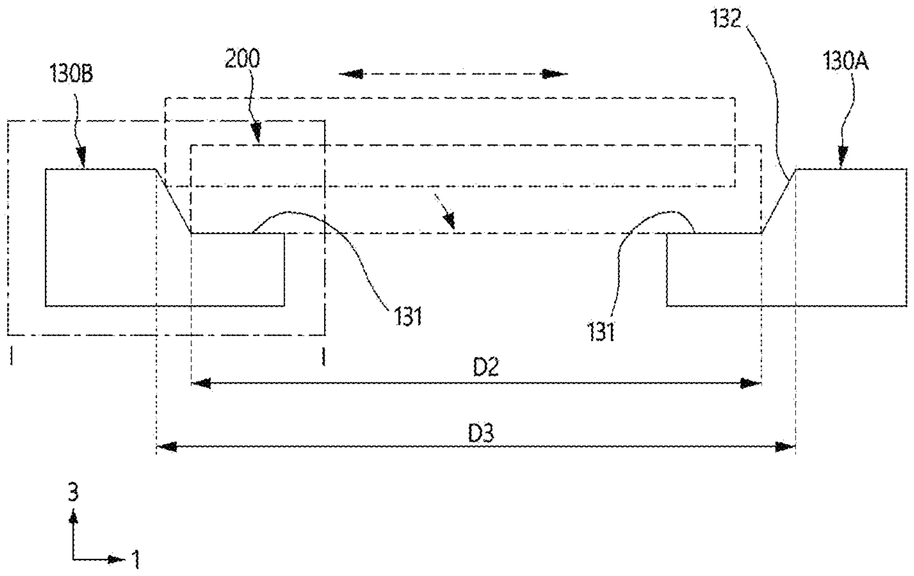

[FIG. 9]
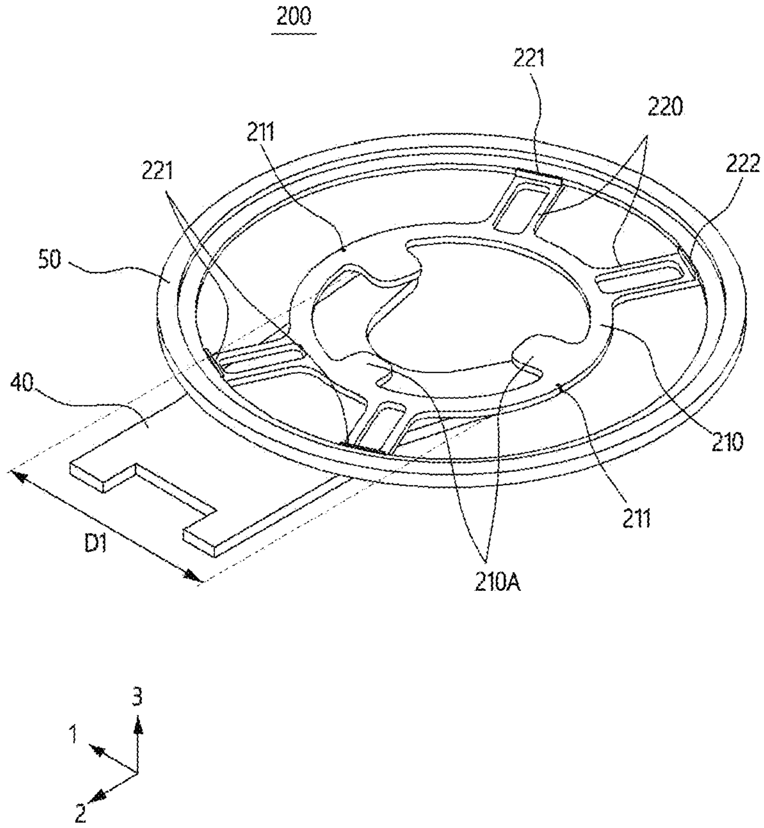
[FIG. 10]
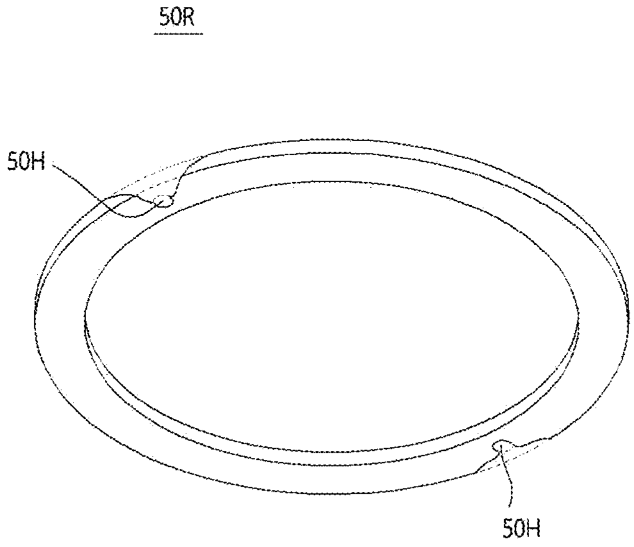

[FIG. 11]
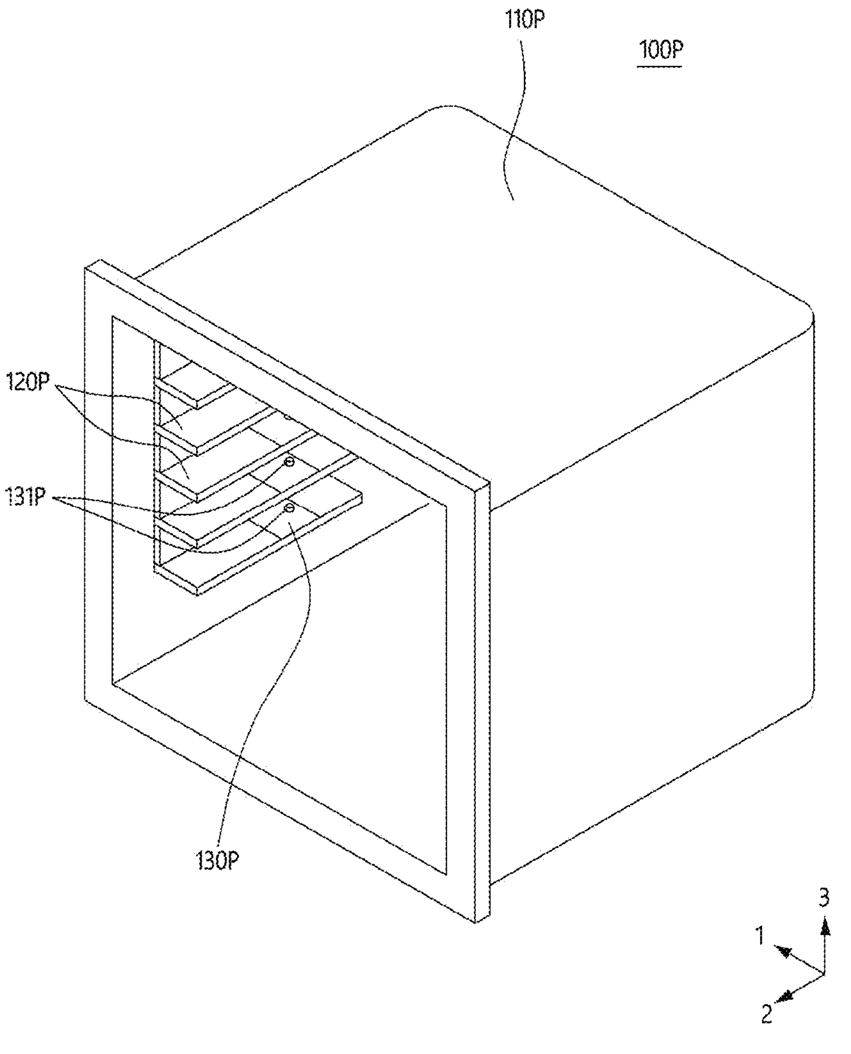

RING CARRIER AND CONTAINER COMPRISING THE SAME

This application claims the benefit of Korean Patent Application No. 10-2023-0120083, filed on Sep. 11, 2023, in the Korean Intellectual Property Office, the disclosure of which is incorporated herein by reference in its entirety.

BACKGROUND

1. Field

The present invention relates to a ring carrier and a container containing the same.

2. Description of the Related Art

The semiconductor device manufacturing process may include an etching process to remove a thin film formed on a substrate (e.g., wafer) using plasma. The etching process is performed by ions and/or radicals in the plasma colliding with or reacting with the thin film on the substrate.

An apparatus that processes a substrate using plasma includes a process chamber, a support chuck (e.g., ESC) that supports the substrate within the process chamber and is connected to an RF power source, and a focus ring that surrounds the outer periphery of the substrate seated in the support chuck. The focus ring is installed to distribute plasma with high uniformity on the surface of the substrate, and is etched together with the substrate by plasma.

When the substrate is repeatedly etched, the focus ring is also etched, so the shape of the focus ring gradually changes. As the shape of the focus ring changes, the direction in which ions and/or radicals enter the substrate changes, thereby changing the etching characteristics of the substrate. Therefore, if etching processing on the substrate is performed more than a predetermined number of times, or if the shape of the focus ring changes and falls outside the allowable range, the focus ring needs to be replaced.

Replacement of the focus ring can be accomplished by removing the used focus ring from the process chamber and installing the unused focus ring into the process chamber. Replacement of the focus ring can be performed by a transfer robot.

Meanwhile, the transfer of the focus ring can be performed by a transfer robot that transfers the substrate. Although the transfer robot transfers the focus ring to a predetermined position within the process chamber, since the position of the transfer robot may be shifted from the correct position due to work errors and/or repeated work, there is a risk that the focus ring may not be placed in the correct position when replacing the focus ring.

SUMMARY

The problem to be solved by the present invention is to provide a ring carrier that can facilitate alignment of the ring carrier supporting the ring (e.g., focus ring) when it is transferred to a container such as a FOUP.

Another problem to be solved by the present invention is to provide a container, in which alignment of the ring carrier can be facilitated when the ring is transferred to the container.

The technical objects of the present invention are not limited to the technical objects mentioned above, and other technical objects not mentioned will be clearly understood by those skilled in the art from the description below.

In order to achieve the above object, one aspect of a container of the present invention accommodates a ring carrier for supporting a ring provided in a substrate processing apparatus and comprises a housing, in which an accommodation space is formed, a slot provided in the housing and having an insertion groove formed therein, and a block located in the insertion groove, wherein the block protrudes from the slot and extends to the ring carrier, and has a support surface for supporting a lower circumference of the ring carrier, and a first inclined surface sloping upward from the support surface in a normal direction of the ring carrier and having a radius larger than an arc of the ring carrier, wherein a boundary line between the support surface and the first inclined surface has a radius at least the same as the arc of the ring carrier.

Another aspect of a container of the present invention comprises a housing, in which an accommodation space is formed, a slot provided in the housing and having an insertion groove formed therein, a block located in the insertion groove and protruding from the slot, and a ring carrier supported on the block and supporting a ring provided in a substrate processing apparatus, wherein the block includes a first extension portion extending in a clockwise or counterclockwise direction in a shape extending along an arc of the ring carrier, a second extension portion extending in a direction opposite to the first extension portion and having a shorter length than the first extension portion, a coupling protrusion protruding toward the slot, a concave groove that is concave in a direction from one side to the other side, and a first bolt hole penetrating from the concave groove in a direction of the slot, wherein the first extension portion and the second extension portion extend in length to an area that does not exceed a width of an end effector so as not to interfere with the end effector in a state, in which the end effector carrying the ring carrier is disposed, wherein the slot has a second bolt hole opposite to the first bolt hole, and a guide groove, into which the coupling protrusion is slidably inserted, wherein the block is provided as a first block and a second block that face each other in the housing and form a pair to support both sides of the ring carrier, wherein each of the first block and the second block has a support surface supporting a lower circumference of the ring carrier, and a first inclined surface sloping upward from the support surface in a normal direction of the ring carrier and having a radius larger than an arc of the ring carrier, and a boundary line between the support surface and the first inclined surface has a radius the same as the arc of the ring carrier, and has a second inclined surface sloping upward in a counterclockwise direction from the support surface to a top of the first inclined surface, and a key provided with a vertical surface perpendicular to a bottom surface on an opposite surface of the second inclined surface, wherein the second inclined surfaces of each of the first block and the second block slope upward in a counterclockwise direction inside the housing to guide the ring carrier in the same direction, wherein the ring carrier includes a base, on which the ring is located, has a radius the same as the boundary line, wherein the base has a keyway that is concave from an edge toward a center and into which the key is inserted, wherein a bottom of the key has the same cross-sectional area as a bottom of the keyway, and a top of the key has a smaller cross-sectional area than the bottom of the keyway.

In order to achieve another object, one aspect of a ring carrier of the present invention is accommodated in the container and comprises a base, on which the ring is located, wherein the base includes a keyway, into which the key of the block is inserted, formed on a circumferential surface.

Specific details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which:

FIG. 1 is a diagram illustrating a substrate processing apparatus provided with a container according to some embodiments of the present invention;

FIG. 2 is a diagram showing a portion of the interior of a container according to some embodiments of the present invention;

FIG. 3 is a plan view showing a ring carrier provided in a container according to the first embodiment of the present invention;

FIG. 4 is a perspective view showing area A of FIG. 3.

FIG. 5 is a perspective view showing area B of FIG. 3.

FIG. 6 is a plan view showing the base of the ring carrier aligned with the key of the container according to the first embodiment of the present invention;

FIG. 7 is a diagram showing a block of a container according to the first embodiment of the present invention;

FIG. 8 is a diagram showing a ring carrier installed along the I-I area of FIG. 7 and adjacent blocks.

FIG. 9 is a diagram showing a ring provided on the ring carrier according to the first embodiment of the present invention;

FIG. 10 is a diagram showing a ring of a comparative example; and

FIG. 11 is a diagram showing a container of a comparative example.

DETAILED DESCRIPTION

Hereinafter, preferred embodiments of the present invention will be described in detail with reference to the attached drawings. The advantages and features of the present invention and methods for achieving them will become clear by referring to the embodiments described in detail below along with the accompanying drawings. However, the present invention is not limited to the embodiments disclosed below and may be implemented in various different forms. The present embodiments are merely intended to ensure that the disclosure of the present invention is complete, is provided to fully inform those skilled in the art on the scope of the invention, and the present invention is only defined by the scope of the claims. Like reference numerals refer to like elements throughout the specification.

The terminology used herein is for describing embodiments and is not intended to limit the invention. As used herein, singular forms also include plural forms, unless specifically stated otherwise in the context. As used herein, "comprises" and/or "comprising" refers to the presence of one or more other components, steps, operations and/or elements. or does not rule out addition.

FIG. 1 is a diagram illustrating a substrate processing apparatus provided with a container according to some embodiments of the present invention. FIG. 2 is a diagram showing a portion of the interior of a container according to some embodiments of the present invention. In addition, FIG. 3 is a plan view showing the ring carrier provided in the container according to the first embodiment of the present invention, FIG. 4 is a perspective view showing area A of FIG. 3, and FIG. 5 a perspective view showing area B of FIG. 3. In addition, FIG. 6 is a plan view showing the base of the ring carrier aligned with the key of the container according to the first embodiment of the present invention, and FIG. 7 is a perspective view showing the block of the container according to the first embodiment of the present invention. Additionally, FIG. 8 is a diagram illustrating a ring carrier installed along the I-I area of FIG. 7 and adjacent blocks.

In addition, FIG. 9 is a diagram showing a ring provided on the ring carrier according to the first embodiment of the present invention.

First, referring to FIGS. 1 to 3, the container 100 may be provided in the load pod 11 of the substrate processing apparatus 10, and a ring 50 (e.g., focus ring) may be accommodated in the accommodation space 111 of the container 100 while the ring 50 is supported on the ring carrier 200. To replace the ring 50, the ring 50 can be moved between the container 100 and the process chamber 14.

For example, if the substrate processing apparatus 10 includes the load pod 11 as well as an index chamber 12, a transfer chamber 13, and a process chamber 14 (e.g., an etching chamber), the ring 50 may be transferred from the container 100 placed on the load pod 11 to the process chamber 13 by the transfer robots 12R and 13R of each of the index chamber 12 and the transfer chamber 13, or may be transferred from the process chamber 13 to the container 100.

Referring to FIGS. 2 to 8, the container 100 may include a housing 110, a slot 120, and a block 130 to accommodate the ring 50. The ring carrier 200 may be accommodated in the container 100 while supporting the ring 50, or may be carried out from the container 100 by the transfer robots 12R and 13R.

The housing 110 may have a structure, in which a plurality of rings 50 are accommodated in a row up and down. For example, the housing 110 may have a box shape, and an accommodation space 111 may be formed therein. Additionally, the housing 110 is provided with a door (not shown) so that the accommodation space 111 can be opened and closed.

The slots 120 may have a bar shape and may be provided in pairs facing each other on a horizontal plane and located on both sides of the ring carrier 200. The slots 120 provided in pairs may be provided to be spaced apart from each other in the vertical direction inside the housing 110 to correspond to the number of rings 50/ring carriers 200. For example, five pairs of slots 120 may be provided to accommodate five rings 50 in the housing 110.

Referring to FIG. 2, the slot 120 may be formed with an insertion groove 121, a guide groove 123, and a second bolt hole 125 in order for the block 130 to be installed. For example, the insertion groove 121 may have a concave groove structure in the direction 1 perpendicular to the longitudinal direction 2 of the slot 120, and the block 130 may be inserted. The guide groove 123 can be inserted by sliding the coupling protrusion 138 (see FIG. 7) of the block 130, and can be formed on both sides of the insertion groove 121. The second bolt hole 125 may be formed at a position opposite to the first bolt hole 137H of the block 130 so that the block 130 can be bolted.

The block 130 may be inserted into the insertion groove 121 and/or coupled with a bolt. As an example, the block 130 may be provided as a first block 130A provided on the right side and a second block 130B provided on the left side in the horizontal plane so as to form a pair facing each other in the housing 110, as shown in FIG. 3.

Unlike the comparative example block 120P of FIG. 11, the block 130 may protrude from the slot 120 and extend to the ring carrier 200. The block 130 may extend to the ring carrier 200 and directly support the ring carrier 200 at a position spaced apart from the slot 120.

Referring to FIG. 7, the block 130 may include a support surface 131, a first inclined surface 132, a boundary line 133, a key 134, a first extension portion 135, a second extension portion 136, a concave groove 137 and a coupling protrusion 138.

The inner diameter of the support surface 131 is smaller than the radius of the ring carrier 200 (see D2 in FIG. 8), so that it can support the lower circumference of the ring carrier 200. The support surface 131 may form an arc, and its outer diameter may have a radius D2 the same as the arc of the ring carrier 200.

The first inclined surface 132 is a configuration that guides the position of the ring carrier 200 with respect to the radial direction (which may include the horizontal direction (1) and the vertical direction (2)) in the horizontal plane, and may slope upward to the normal line of the ring carrier 200 from the support surface 131.

Referring to FIG. 8, the first inclined surface 132 may have a radius D3 that is larger than the radius D2 of the ring carrier 200. In the first inclined surface 132 having a radius D3 greater than the radius D2 of the ring carrier 200, since the circle or arc virtually connecting the first block 130A and the second block 130B is formed larger than the arc of the ring carrier 200, the ring carrier 200 may be lowered to an area with the same radius D2 as the ring carrier 200 in the area (area with radius D3) larger than the ring carrier 200.

In other words, the ring carrier 200 can be lowered to the support surface 131 along the first inclined surface 132, so that since it can be installed according to the upper radius D3 of the first inclined surface 132, which is larger than the radius of the ring carrier 200, installation can be easier compared to installation in an area that matches the area of the ring carrier 200.

And the boundary line 133 between the support surface 131 and the first inclined surface 132 may have a radius D2 that is at least the same as the arc of the ring carrier 200. As an example, the boundary line 133 has the same radius D2 as the arc of the ring carrier 200, so when the ring carrier 200 is lowered along the first inclined surface 132, the ring carrier 200 surrounding the boundary line 133 can maintain a stably seated state by being surrounded by the first inclined surface 132 on the support surface 131.

Referring to FIGS. 6 and 7, the key 134 is a configuration that aligns the ring carrier 200 with the block 130, and may protrude upward from the support surface 131 to be inserted into the keyway 211.

Referring to FIG. 5, the top width (H1) of the key 134 may be formed to be smaller than the bottom width (H2) of the keyway 211, and the bottom width (H2) of the key 134 may be the same as the bottom width (H2) of the keyway 211.

Referring to FIGS. 4 to 7, the key 134 may include a second inclined surface 134S and a vertical surface 134L.

The second inclined surface 134S is a configuration that guides the rotation angle of the ring carrier 200 in the horizontal plane (plane of the X axis 1 and Y axis 2), and for example, the position of the ring carrier 200 can be guided so that the ring carrier 200 is maintained in the correct position with respect to the horizontal central axis C1 and/or the vertical central axis C2.

Referring to FIG. 6, when the ring carrier 200 is installed, the second inclined surface 134S guides the keyway 211 in a counterclockwise direction and aligns it in the correct position. Here, reference numerals C1' and C2' illustrate axes, in which the ring carrier 200 is distorted from its correct position.

The second inclined surface 134S may slope upward in a counterclockwise or clockwise direction from the support surface 131 to the top of the first inclined surface 132. For example, referring to FIGS. 4 to 6, the second inclined surfaces 134S of each of the first block 130A and the second block 130B slope upward in the same direction inside the housing 110, and may slope upward in a counterclockwise direction from the support surface 131 to the top of the first inclined surface 132. That is, the second inclined surface 134S may slope in a clockwise direction downward from the same height as the first inclined surface 132 to the support surface 131.

The second inclined surface 134S1 of the first block 130A and the second inclined surface 134S2 of the second block 130B may be paired to guide the ring carrier 200. In other words, the second inclined surface 134S1 of the first block 130A may guide the right side of the ring carrier 200, and the second inclined surface 134S2 of the second block 130B may guide the left side of the ring carrier 200.

At this time, the vertical surface 134L (see FIG. 5) provided on the opposite side of each of the second inclined surface 134S1 of the first block 130A and the second inclined surface 134S2 of the second block 130B may be provided at opposite positions in the horizontal plane. Based on FIG. 6 (the bottom of FIG. 6 means the front direction, and the top of FIG. 6 means the back direction), the vertical surface 134L of the first block 130A may be located behind the second inclined surface 134S1, and the vertical surface 134L of the second block 130B may be located in front of the second inclined surface 134S2.

For example, inside the housing 110, the first block 130A and the second block 130B may be arranged in positions rotated 150° to 200° from each other on the horizontal plane, and for example, may be in positions rotated 180° from each other.

Accordingly, when the ring carrier 200 is lowered, the keyway 211 is inserted from the top of the key 134 and gradually descends in a clockwise direction along the second inclined surface 134S1 that slopes downward in a clockwise direction to be guided to the correct position. In the process of guiding the keyway 211 in a clockwise direction, the key 134 is inserted into the keyway 211 and the ring carrier 200 can be aligned in the correct position. Referring to FIG. 5, the top width (H1) of the key 134 is smaller than the bottom width (H2) of the keyway 211, so that the key 134 can be easily inserted into the keyway 211.

The vertical surface 134L may have a shape perpendicular to the bottom surface on the opposite side of the second inclined surface 134S. The vertical surface 134L may be in contact with or opposed to the keyway 211, and may be provided in contact with the keyway 211 in a state, in which the key 134 is inserted into the keyway 211, to prevent the ring carrier 200 mounted on the block 130 from shaking. That is, the vertical surface 134L may perform a stopper function to block the movement of the ring carrier 200.

For example, the vertical surface 134L is in contact with the rear of the keyway 211 on the right side of the ring carrier 200, and in contact with the front of the keyway 211 on the left side of the ring carrier 200 with respect to FIG. 6, so the yawing movement of the ring carrier 200 can be blocked.

Referring again to FIG. 3, the first extension portion 135 may extend in a clockwise or counterclockwise direction. The first extension portion 135 may extend in the same direction, for example in a clockwise direction, in each of the first block 130A and the second block 130B.

For example, if the first block 130A is rotated 180 degrees, it can have the same shape as the second block 130B. Accordingly, the first block 130A and the second block 130B can be provided as one injection molded product.

The second extension portion 136 may extend in a direction opposite to the first extension portion 135, and when the first extension portion 135 extend in a clockwise direction, the second extension portion 136 may extend in a counterclockwise direction.

In other words, the first extension portion 135 and the second extension portion 136 may extend in opposite directions from the block 130 to expand the area supporting the ring carrier 200.

In addition, the second extension portion 136 may be formed to be shorter in length than the first extension portion 135. Accordingly, the second extension portion 136 is easy to distinguish from the first extension portion 135, so that workers can easily recognize the block 130, making installation easy. When the block 130 is installed in the housing 110 in an eccentric form, it can have a structure that does not interfere with the end effector 40.

For example, the first extension portion 135 and the second extension portion 136 may have a length up to an area that does not exceed the width D1 of the end effector 40 so as not to interfere with the end effector 40 in a state, in which the end effector 40 carrying the ring carrier 200 is disposed.

In addition, in the first extension portion 135 and the second extension portion 136, the support surface 131 and the first inclined surface 132 may be formed in the same or similar manner so that the cross-sectional area supporting the ring carrier 200 is expanded. And the key 134 may be formed on any one of the first extension portion 135 or the second extension portion 136. For example, the key 134 may be formed on the first extension portion 135.

Meanwhile, referring to FIG. 3, the positions of the first block 130A and the second block 130B are eccentric from the horizontal central axis C1, and the lengths of the first extension portion 135 and the second extension portion 136 are different, but are not limited to this. As another example, the first extension portion 135 and the second extension portion 136 may be arranged without being eccentric on the horizontal central axis C1 in the horizontal direction, and various modified examples, such as being formed to have the same length, are possible.

The concave groove 137 may be concavely formed from one side where the support surface 131 and the first inclined surface 132 are located to the other side (see direction 1 in FIG. 3). A first bolt hole 137H may be formed inside the concave groove 137. The first bolt hole 137H penetrates from the concave groove 137 toward the slot 120, that is, penetrates in the direction in which the concave groove 137 is formed, so that the slot 120 and the block 130 are connected with a bolt.

The coupling protrusion 138 may protrude toward the slot 120. As an example, the coupling protrusions 138 may be provided in pairs on both sides based on the direction in which the block 130 is inserted into the insertion groove 121. The coupling protrusion 138 may have a length in the horizontal direction 1 in the horizontal plane so that it can be slidably coupled to the guide groove 123 of the slot 120.

Hereinafter, the ring carrier accommodated in the container 100 of this embodiment will be described with reference to the drawings.

Referring to FIGS. 3 and 9, the ring carrier 200 supporting the ring 50 can move between the container 100 and the process chamber by transfer robots 12R and 13R (see FIG. 1) equipped with an end effector 40. The ring carrier 200 may be accommodated in the container 100 while the ring 50 is supported.

The ring carrier 200 may include a base 210 and finger 220.

The base 210 may have a ring shape and may have the same radius as the boundary line 133 of the block 130, and the ring 50 may be located at the top. In the base 210, the keyway 211, into which the key 134 is inserted, may be formed on the circumferential surface of the base 210 so that the ring carrier 200 is not caught on the key 134 and its position is guided as the ring carrier 200 is lowered in the direction of the block 130. That is, the keyway 211 into which the key 134 is inserted may be formed on the circumferential surface of the base 210, and the keyway 211 may be formed in a concave groove structure from the edge of the base 210 toward the center.

In addition, the base 210 may be formed with an expansion area 210A whose area is expanded inward to allow vacuum suction of the end effector 40 to be performed. As an example, three expansion areas 210A are shown, but it can be modified depending on the structure/shape of the end effector 40.

The finger 220 support the ring 50 and may be provided in plural numbers spaced apart from each other along the circumference of the base 210, and may be provided with guide protrusions 221 and 222.

The guide protrusions 221 and 222 may protrude to be in contact with or oppose to the inner peripheral surface of the ring 50, and the flat zone of the ring 50 can be aligned in the correct position by the guide protrusions 221 and 222.

For example, in any one of the plurality of fingers 220, the guide protrusion 222 may form a straight section rather than a circumference on a horizontal plane, and may correspond to a flat zone of the ring 50. The remaining guide protrusions 221 may form an arc with a radius the same as the inner diameter of the ring 50 and may correspond to the round zone of the ring 50.

This ring carrier 200 can align the flat zone position of the ring 50 by the guide protrusion 222, and can be aligned in the correct position in the radial direction (forward-backward and/or left-right direction) by the first inclined surface 132, and can be aligned in the correct position by the keyway 211 without being distorted with respect to the horizontal central axis (C1)/vertical central axis (C2).

Therefore, in the ring carrier 200 of this embodiment, the ring 50 and/or the ring carrier 200 can be aligned even if the pin 131P formed in the container 100P of the comparative example is omitted, so unlike the ring 50R of the comparative example of FIG. 10, the through hole 50H into which the pin 131P is inserted can be omitted.

Accordingly, the ring carrier 200 and the container 100 of this embodiment prevent the use period of the ring 50 from being reduced due to etching and/or damage around the through hole 50H formed in the comparative example ring 50.

Hereinafter, the ring and container of the comparative example will be described with reference to the drawings.

FIG. 10 is a diagram showing a ring of a comparative example, and FIG. 11 is a diagram showing a container of a comparative example.

Referring to FIGS. 10 and 11, in the comparative example ring 50R, a through hole 50H may be formed to be inserted by the pin 131P of the block 130 installed in the slot 120P so that the position is aligned when accommodated in the container 100P of the comparative example.

The through hole 50H has a structure that penetrates the ring 50R, and the ring 50R around the through hole 50H is formed to have a narrow width. Therefore, when the ring 50R is etched, the ring 50R around the through hole 50H can be easily damaged.

On the other hand, since the ring 50 accommodated in the container 100 of this embodiment does not need to be aligned with the pin 131P, the through hole 50H can be omitted, and the use time of the ring 50 can be extended.

Although the embodiments of the present invention have been described with reference to the above and accompanying drawings, those skilled in the art to which the present invention pertains can understand that the present invention can be practiced in other specific forms without changing the technical spirit or essential features. Therefore, the embodiments described above should be understood as illustrative in all respects and not limiting.

REFERENCE NUMERAL

| | |
|---|---|
| 10: substrate processing apparatus | 11: load pod |
| 12: index chamber | 50: ring |
| 100: container | 110: housing |
| 120: slot | 130: block |
| 200: ring carrier | 210: base |
| 220: finger | |

What is claimed is:

1. A container accommodating a ring carrier for supporting a ring in a substrate processing apparatus, comprising:
- a housing, in which an accommodation space is defined;
- a slot in the housing, the slot defining an insertion groove; and
- a block in the insertion groove,
- the block protruding from the slot and extending to the ring carrier, the block having a support surface for supporting a lower circumference of the ring carrier, and a first inclined surface sloping upward from the support surface in a direction away from the ring carrier, the first inclined surface having a radius larger than an arc of the ring carrier,
- wherein a boundary line between the support surface and the first inclined surface has a radius at least equal to the arc of the ring carrier, and
- wherein the block includes a key protruding upward from the support surface,
- the key including:
- a second inclined surface sloping upward in a clockwise or counterclockwise direction from the support surface; and
- a vertical surface perpendicular to the support surface on a surface opposite to the second inclined surface.

2. The container of claim 1, wherein a top of the key has a first elevation that is equal to a second elevation of a top of the first inclined surface.

3. The container of claim 1, wherein the block includes a first block and a second block that are identical to each other and face each other in the housing and form a pair to support both sides of the ring carrier,
- wherein the second inclined surfaces of each of the first block and the second block slope upward in a same direction inside the housing.

4. The container of claim 1, wherein the first block and the second block are disposed in positions rotated by 150° to 200° from each other in a horizontal plane inside the housing.

5. The container of claim 1, wherein the block further includes a first extension portion extending in a clockwise or counterclockwise direction along the arc of the ring carrier.

6. The container of claim 5, wherein the block further includes
- a second extension portion extending in a direction opposite to the first extension portion and having a shorter length than the first extension portion.

7. The container of claim 6, wherein the first extension portion and the second extension portion extend at a first length into an area that does not exceed a width of an end effector so as not to interfere with the end effector in a state, in which the end effector carrying the ring carrier is disposed.

8. The container of claim 1, wherein the block has a concave groove formed from one side where the support surface and the first inclined surface are located to the other side.

9. The container of claim 8, wherein the block defined a first bolt hole penetrating from the concave groove in a direction of the slot,
- wherein the slot has a second bolt hole opposite to the first bolt hole.

10. The container of claim 1, wherein the block further includes a coupling protrusion that protrudes toward the slot,
- wherein the slot further defines a guide groove, into which the coupling protrusion is slidably inserted.

11. The container of claim 1, wherein the ring carrier includes a base, on which the ring is located, the base having a radius that is the same as the boundary line,
- wherein the base defined a keyway, into which the key is inserted, on a circumferential surface.

12. A container comprising:
- a housing, in which an accommodation space is defined;
- a slot in the housing, the slot defining an insertion groove formed therein;
- a block in the insertion groove, the block protruding from the slot; and
- a ring carrier supported on the block, the ring carrier supporting a ring provided in a substrate processing apparatus,
- wherein the block includes,
- a first extension portion extending in a clockwise or counterclockwise direction in a shape extending along an arc of the ring carrier, a second extension portion extending in a direction opposite to the first extension portion and having a shorter length than the first extension portion, a coupling protrusion protruding toward the slot, a concave groove that is concave in a direction from one side to the other side, and a first bolt hole penetrating from the concave groove in a direction of the slot,
- the first extension portion and the second extension portion, each extending at a first length into an area that does not exceed a width of an end effector so as not to interfere with the end effector in a state, in which the end effector carrying the ring carrier is disposed,
- the slot having a second bolt hole opposite to the first bolt hole, and a guide groove, into which the coupling protrusion is slidably inserted, the block including a first block and a second block that are identical to each other and face each other in the housing and form a pair to support both sides of the ring carrier, each of the first block and the second block, including a support surface configured to support a lower circumference of the ring carrier, and a first inclined surface sloping upward from the support surface in a normal direction of the ring carrier and having a radius larger than an arc of the ring carrier, with a boundary line between the support surface and the first inclined surface that has a radius equal to the arc of the ring carrier, and a second inclined surface sloping upward in a counterclockwise direction from the support surface to a top of the first inclined surface, and a key provided with a vertical surface perpendicular to the support surface on an opposite surface of the second inclined surface, the second inclined surfaces of each of the first block and the second block slope upward in a counterclockwise direction inside the housing to guide the ring carrier in the same direction, the ring carrier including a base, on which the ring is located, the ring carrier having a radius the same as the boundary line, the base defining a keyway that is concave from an edge toward a center and into which the key is inserted, wherein a bottom of the key has a same cross-sectional area as a bottom of the keyway, and a top of the key has a smaller cross-sectional area than the bottom of the keyway.

13. The container of claim 1, wherein the ring carrier includes a base, on which the ring is located, the base defining a keyway on a circumferential surface, into which the key is inserted.

14. The ring carrier of claim 13 further comprises, a plurality of fingers spaced apart from each other along a circumference of the base and supporting the ring.

15. The ring carrier of claim 14, wherein each of the plurality of fingers includes, a guide protrusion protruding to contact or oppose an inner peripheral surface of the ring.

16. The ring carrier of claim 15, wherein, in one of the plurality of fingers, the guide protrusion does not form a circumference but forms a straight section on a horizontal plane.

* * * * *